United States Patent [19]

Kumamaru et al.

[11] Patent Number: 4,485,393
[45] Date of Patent: Nov. 27, 1984

[54] SEMICONDUCTOR DEVICE WITH SELECTIVE NITRIDE LAYER OVER CHANNEL STOP

[75] Inventors: Kuniaki Kumamaru, Kawasaki; Shunichi Hiraki, Yokohama; Toshio Yonezawa, Yokosuka, all of Japan

[73] Assignee: Tokyo Shibaura Denki Kabushiki Kaisha, Japan

[21] Appl. No.: 267,420

[22] Filed: May 26, 1981

Related U.S. Application Data

[63] Continuation of Ser. No. 038,284, May 11, 1979, abandoned.

[30] Foreign Application Priority Data

May 16, 1978 [JP] Japan ................ 53-57099

[51] Int. Cl.³ ............................ H01L 29/34
[52] U.S. Cl. ........................ 357/52; 357/34; 357/35; 357/51; 357/54
[58] Field of Search ............ 357/34, 35, 51, 52, 357/54

[56] References Cited

U.S. PATENT DOCUMENTS

| | | | |
|---|---|---|---|
| 3,649,886 | 3/1972 | Kool | 357/54 |
| 3,912,559 | 10/1975 | Harigaya et al. | 357/52 |
| 3,922,709 | 11/1975 | Wallmark et al. | 357/54 |
| 3,959,025 | 5/1976 | Polinsky | 357/91 |
| 4,000,507 | 12/1976 | Nishida et al. | 357/52 |
| 4,012,762 | 3/1977 | Abe et al. | 357/52 |
| 4,015,281 | 3/1977 | Nagata et al. | 357/52 |
| 4,048,350 | 9/1977 | Glang et al. | 357/52 |
| 4,055,884 | 11/1977 | Jambotkar | 357/23 |
| 4,060,827 | 11/1977 | Ono et al. | 357/54 |
| 4,086,614 | 4/1978 | Scheidel | 357/52 |
| 4,090,213 | 5/1978 | Maserjian et al. | 357/52 |
| 4,163,985 | 8/1979 | Schuermeyer et al. | 357/54 |
| 4,172,158 | 10/1979 | Li | 357/52 |
| 4,176,372 | 11/1979 | Matsushita et al. | 357/52 |

OTHER PUBLICATIONS

L. Maheux, "Transistor for Monolithic Circuits," IBM Tech. Discl. Bull., vol. 11, #12, May 1969, pp. 1690, 1691.

K. Nagano et al., "Al₂O₃-Complementary MOS Transistors," Proc. 1st Conf. on S-S Devices, Tokyo, 1969 J. Jap. Suc. Appl. Phys., vol. 39, 1970, pp. 132–136.

*Primary Examiner*—Joseph E. Clawson, Jr.
*Attorney, Agent, or Firm*—Finnegan, Henderson, Farabow, Garrett & Dunner

[57] ABSTRACT

A semiconductor device comprises a semiconductor body of one conductivity type, at least one semiconductor region of the opposite conductivity type formed in the semiconductor body and having a surface flush with the surface of the semiconductor body, an insulative or semi-insulative film formed on the semiconductor body or semiconductor region through a passivation layer and having a fixed charge, positive or negative, and an electrode metal layer connected to at least one of the semiconductor body and region and formed locally on the film directly or through a passivation layer. The semiconductor body or region is of N conductivity type when the film has a positive fixed charge and of P conductivity type when the film has a negative fixed charge.

6 Claims, 14 Drawing Figures

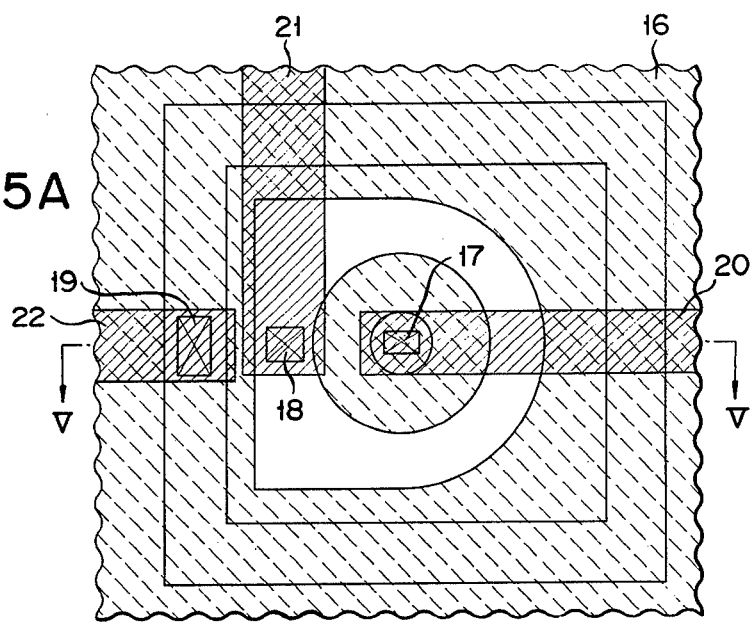
FIG. 5A
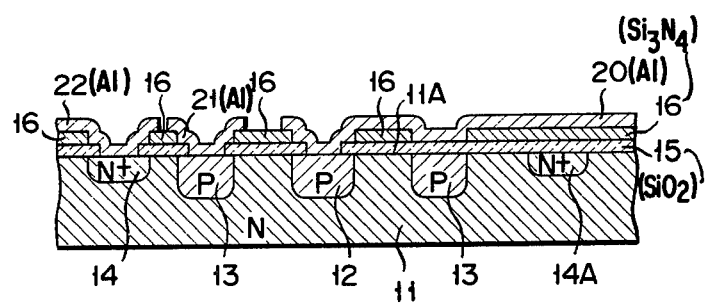
FIG. 5B
FIG. 6
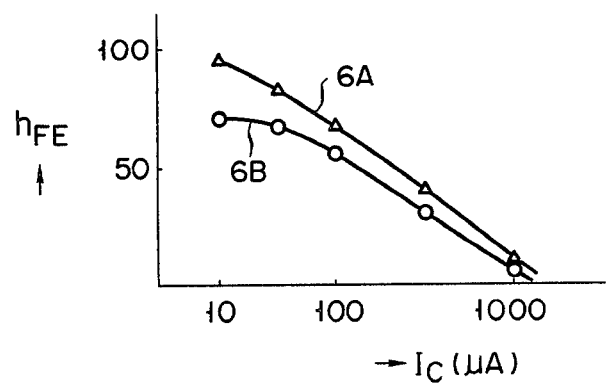

SEMICONDUCTOR DEVICE WITH SELECTIVE NITRIDE LAYER OVER CHANNEL STOP

This is a continuation of application Ser. No. 06/038,284, filed May 11, 1979 now abandoned.

BACKGROUND OF THE INVENTION

This invention relates to a semiconductor device, more particularly an integrated circuit device of a high breakdown voltage.

Generally a semiconductor device, in particular a bipolar integrated circuit device comprises, as shown in FIG. 1, a semiconductor substrate 1 of one conductivity type and two or more impurity regions 2 and 3 of the opposite conductivity type formed in the substrate 1 and arranged at predetermined intervals. The regions 2 and 3 have surfaces flush with that of the substrate 1 and constitute emitter E and collector C of, for example, a lateral transistor, respectively. On the surface of the substrate 1 including the surfaces of the regions 2 and 3, an insulative film 4 is locally formed. Further, on the film 4 and the surfaces of the regions 2 and 3, aluminum electrodes 5 are provided.

The substrate 1 is made of silicon. The film 4, which protects the lateral transistor, is usually made of silicon dioxide (SiO$_2$) which is stable both physically and chemically. The film 4 should be made of clean SiO$_2$ containing no contaminants. Otherwise, the contaminants would accumulate in the film-to-substrate interface 1A to build up a leak current. A leak current would lower the breakdown voltage of the PN junction, thereby reducing the reliability of the lateral transistor.

A leak current will flow even if the film 4 is made of clean SiO$_2$. More specifically, a current can flow in the emitter E and collector C of the lateral transistor, even if no input voltage is applied on the base B. This means a short circuit has occured between the emitter E and collector C, as often takes place in a discrete transistor. The lateral transistor must be replaced by a new one if a leak current flows in it.

The inventors of this invention consider that the MOS structure constituted by the silicon substrate 1, insulative film 4 and aluminum electrodes 5 is responsible for such a leak current. That is, despite the threshold voltage specific to the MOS lateral transistor, positive charge accumulates between the substrate 1 and the electrodes 5 to form an inversion channel 6 when a voltage is applied on the electrodes 5. Through this channel 6 the emitter E and collector C are shortcircuited, and a leak current therefore flows between them. It is ascertained that the leak current affects the current amplification factor $\beta$ of the transistor, which is expressed as $\beta = I_C/I_B$, where $I_C$ and $I_B$ denote collector current and base current, respectively. The leak current renders the base current $I_B$ unstable, and the current amplification factor $\beta$ becomes unstable.

To avoid a leak current it is sufficient to thicken the SiO$_2$ film 4 to raise the threshold voltage of the MOS lateral transistor and thereby prevent formation of an inversion channel 6. If the SiO$_2$ film 4 is made thicker, however, the aluminum electrodes 5 will more likely be broken when wires are led out from them.

In known integrated circuit devices a diffusion layer of a high impurity concentration, which is called "channel-diffusion layer" or "channel stopping zone", is formed to surround semiconductor elements such as transistors so as to avoid the channel effect. If an electrode metal layer is formed on the diffusion layer, an electric field intensity at N+N or P+P junction surfaces is more intense than at any other portions. As a result, the widthstand voltage at the N+N or P+P junction surfaces will become too low.

SUMMARY OF THE INVENTION

It is an object of this invention to provide a semiconductor device which prevents an unwanted channel from being formed at the surface of a semiconductor substrate.

Another object of this invention is to provide an integrated circuit device of a high breakdown voltage.

A semiconductor device according to this invention includes a semiconductor body of one conductivity type, at least one semiconductor region of the opposite conductivity type formed in the semiconductor body and having a surface flush with the surface of the semiconductor body, an insulative or semi-insulative film formed on the semiconductor body or the semiconductor region through a passivation layer and having a positive or negative fixed charge, and an electrode metal layer connected to at least one of the semiconductor body and region and formed locally on the insulative or semi-insulative film directly or through a passivation layer. In case the insulative or semi-insulative film has a positive fixed charge, the semiconductor body or region below the film has N conductivity type. In case the film has a negative fixed charge, the body or region below the film has P conductivity type. The semiconductor device further includes a channel-cut region which is formed in the semiconductor body and close to the surface thereof thereby to prevent an inversion channel from being formed. At least a part of the insulative or semi-insulative film is located above the channel-cut region.

The insulative film may be made of silicon nitride to have a positive fixed charge, or of aluminum oxide such as Al$_2$O$_3$ to have a negative fixed charge. The semi-insulative film may be made of amorphous silicon to have a positive fixed charge.

BRIEF DESCRIPTION OF THE DRAWINGS

FIG. 5(A) is a plan view of a semiconductor device according to this invention, showing the internal structure of the device;

FIG. 5(B) is a cross sectional view of the device shown in FIG. 5(A), taken along line V—V in FIG. 5(A);

FIG. 6 is a graph showing the relationship between current amplification factor (h$_{fe}$) and output current I$_C$;

DESCRIPTION OF THE PREFERRED EMBODIMENTS

Before a few embodiments of this invention are described, the basic inventive points will be described with reference to FIGS. 2 to 4.

Figure 2:
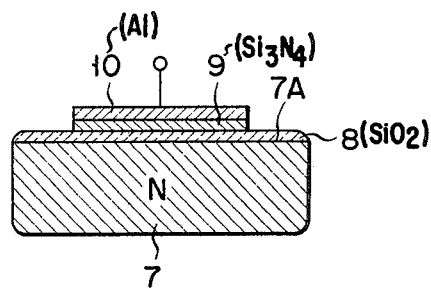
FIG. 2 is a cross sectional view of a semiconductor device, illustrating the principles of this invention.
Figure 3:
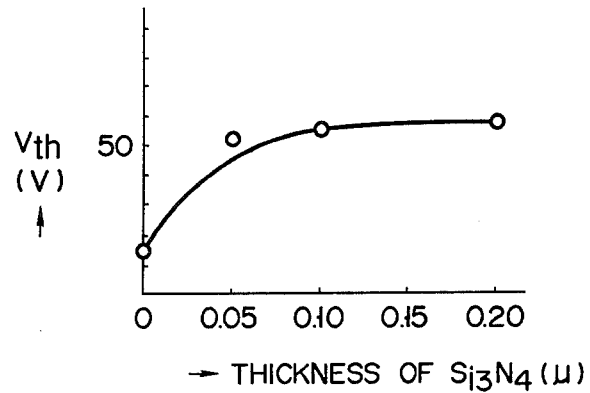
FIGS. 3 and 4 are graphs showing how threshold voltage is elevated as a silicon nitride film grows thicker.

FIG. 2 is a cross sectional view of a semiconductor device. The device comprises a semiconductor substrate 7 of one conductivity type, a $SiO_2$ film 8 formed by thermal oxidation on the upper surface of the substrate 7, a silicon nitride film 9 locally formed on the $SiO_2$ film 8 and an aluminum electrode 10 formed on the silicon nitride film 9.

The silicon nitride film 9 is provided between the $SiO_2$ film 8 and the aluminum electrode 10 to prevent a positive charge in the interface 7A between the substrate 7 and the $SiO_2$ film 8, right below the electrode 10. That is, the positive charge of the silicon nitride film 9 induces a negative charge in the interface 7A. It is therefore unnecessary to form the $SiO_2$ film 8 so thick. Further, the film 9 is provided because it functions as a passivation layer. Still further, the film 9 is formed on the $SiO_2$ film 8 for another reason. That is, the interface 7A is distorted since the linear expansion coefficient of the silicon substrate 7 ($2.4 \times 10^{-6}$ deg$^{-1}$) differs from the linear expansion coefficent of the $SiO_2$ film 8 ($0.35 \times 10^{-6}$ deg$^{-1}$), particularly when the $SiO_2$ film 8 is formed thick. The silicon nitride film 9, which has a linear expansion coefficient similar to that of the silicon substrate 7, can compensate for said "distortion" of the interface 7A.

If the $SiO_2$ film 8 is 1.5 micron thick, the optimum thickness of the silicon nitride film 9 is about 800 Å. This is because, as FIG. 3 shows, the threshold voltage Vth of the semiconductor device increases in proportion to the thickness $tSi_3N_4$ of the silicon nitride film 9 and is saturated when $tSi_3N_4$ is about 800 Å (=0.08 micron).

Figure 4:
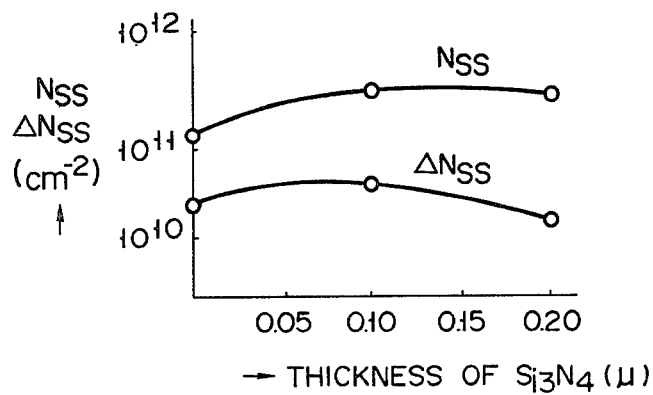

FIG. 4 shows the results of the MNOS capacitance detection conducted on the $Al$-$Si_3N_4$-$SiO_2$-$Si$ structure of FIG. 2, using the thickness of $Si_3N_4$ as a parameter, to see whether or not the positive charge in the interface 7A varies when the $Si_3N_4$ film 9 is formed. As FIG. 4 clearly shows, the apparent charge Nss in the interface 7A changes from about $1 \times 10^{11}$ cm$^{-2}$ to about $5 \times 10^{11}$ cm$^{-2}$, becoming about five times as large, when the thickness of $Si_3N_4$ is increased from 0 to 0.08 micron. Further FIG. 4 shows the results of the bias-temperature (BT) treatment conducted on the device of FIG. 2 at 300° C. for 10 minutes in an electric field of $10^6$ V/cm, using Vth as the parameter, to see whether or not the amount Nss of movable ions in the interface 7A changes. As FIG. 4 shows, Nss is about $4 \times 10^{10}$ cm$^{-2}$ to $5 \times 10^{10}$ cm$^{-2}$, no matter whether the $Si_3N_4$ film 9 is provided or not. Thus it is ascertained that the increase of Nss has not been caused by the movable ions. Since the increase of Nss does not depend on the thickness of the $Si_3N_4$ film 9, it is sufficient to form the $Si_3N_4$ film 9 about 800 Å thick. If the film 9 is 800 Å thick, Vth will be saturated as mentioned above.

Figure 1:
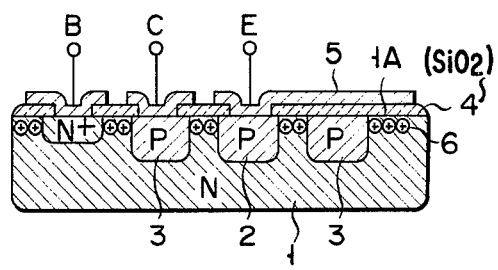
FIG. 1 is a cross sectional view of a known lateral transistor.

The silicon substrate used in the devices shown in FIGS. 1 and 2 has <100> crystal plane.

As mentioned above, this invention uses a silicon nitride film to make it possible to enhance the threshold voltage of a semiconductor device and compensate for "distortion" of the $SiO_2$-$Si$ interface.

FIG. 5(A) is a plan view of a lateral transistor according to this invention, and FIG. 5(B) is a cross sectional view of the lateral transistor taken along line V—V in FIG. 5(A). The lateral transistor comprises an N type semiconductor substrate 11, a P type emitter region 12 formed in the substrate 11 by impurity diffusion, a P type collector region 13 formed in the substrate 11 by impurity diffusion, and a channel-cut region 14A of N conductivity type formed in the substrate 11 by impurity diffusion so as to surround the emitter region 12 and collector region 13. The regions 12, 13 and 14A have their surfaces flush with the surface of the substrate 11. A portion 14 of the channel-cut region 14A fuctions as a base contact region. The regions 12, 13 and 14 have such sizes as to define a base width. On the substrate 11 and the regions 12, 13, 14 and 14A a $SiO_2$ film 15 is locally formed to cover PN junctions formed in the substrate 11. Further, on the substrate 11 but not on the emitter region 12 and collector region 13—that is, on the base region, a silicon nitride film 16 is formed through the $SiO_2$ film 15 thereby to elevate the threshold voltage of the base region of the transistor and thus to prevent a leak current from flowing to the collector region 13 to the emitter region 12. The emitter region 12, the collector region 13 and the base contact region 14 are exposed through electrode contact openings 17, 18 and 19, respectively. In these openings 17, 18 and 19 an emitter electrode 20, a collector electrode 21 and a base electrode 22 are formed and extend outwards. The silicon nitride film 16 is formed on that part of a bipolar integrated circuit device which needs to have a high threshold voltage—that is, for example, on the base region of the lateral transistor.

That is, the silicon nitride film 16 having a positive charge is formed above the channel-cut region 14A and above those portions of the substrate 11 which lie between the emitter region 12 and the collector region 13 and between the collector region 13 and the base contact region 14. No inversion channel would therefore be formed in an interface 11a between the substrate 11 and the $SiO_2$ film 15. Thus, a leak current would never flow from the emitter region 12 to the collector region 13 so long as no input signal is applied to the base electrode 22. In addition, the silicon nitride film 16, which is formed at the above-mentioned positions, eliminates "distortion" of the interface 11A between the Si substrate 11 and the $SiO_2$ film 15. As a result, the lateral transistor can have a large current amplification factor $h_{FE}$ when the output current $I_C$ is small, as illustrated in FIG. 6. Further, no parasitic channel is formed in the lateral transistor, and this helps stabilize the amplification factor $\beta$. In FIG. 6, curve 6A shows the relationship between $h_{FE}$ and $I_C$ in case a $Si_3N_4$ film is provided, and curve 6B the relationship between $h_{FE}$ and $I_C$ in case no $Si_3N_4$ film is provided.

Figure 7A:
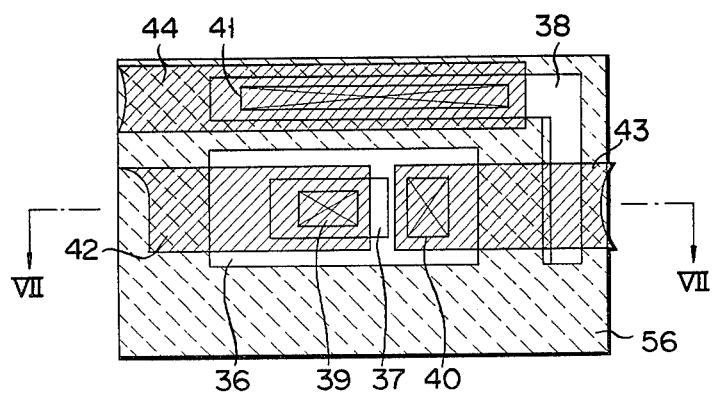
FIG. 7(A) is a plan view of another semiconductor device according to this invention, showing the internal structure of the device.
Figure 7B:
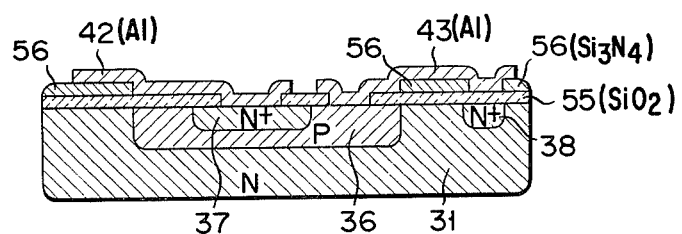
FIG. 7(B) is a cross sectional view of the device shown in FIG. 7(A), taken along line VII—VII in FIG. 7(A)

FIG. 7(A) is a plan view of a vertical transistor according to this invention which is incorporated in a bipolar integrated circuit device, and FIG. 7(B) is a cross sectional view of the vertical transistor taken along line VII—VII in FIG. 7(A). The vertical transistor comprises a N type semiconductor substrate 31, a P type base region 36 formed in the substrate 31, an N type emitter region 37 formed in the base region 36 and an N type collector contact region 38 formed in the substrate 31. The surfaces of the regions 36, 37 and 38 are flush with the surface of the substrate 31. On the substrate 31 and the regions 36, 37 and 38 a $SiO_2$ film 55 is locally formed. On the $SiO_2$ film but not above the regions 36, 37 and 38, a silicon nitride film 56 is formed. Thus, the emitter region 37, the base region 36 and collector contact region 38 are exposed through contact openings 39, 40 and 41, respectively. In these contact openings 39, 40 and 41 an emitter electrode 42, a base electrode 43 and a collector electrode 44 are formed and extend outwards.

The silicon nitride film 56 is not formed above the P type base region 36. Were the film 56 formed above the base region 36, it would have a positive charge and would attact a negative charge to the surface of the substrate 31. If this happens, electrons would form a channel path between the emitter region 37 and the collector contact region 38, thus allowing a leak current to flow.

Figure 8A:
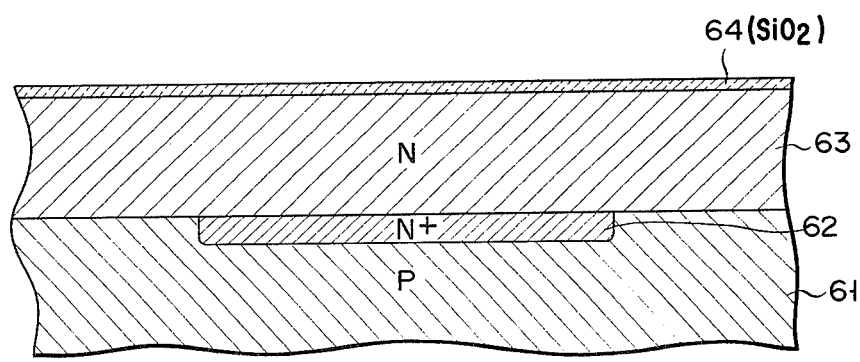
FIGS. 8(A) to 8(D) illustrate how to form the device of FIGS. 7(A) and 7(B) in a bipolar integrated circuit.
Figure 8B:
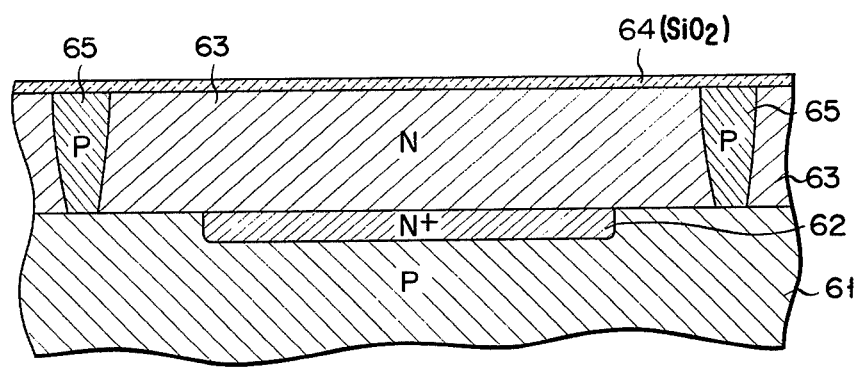

FIGS. 8(A) to 8(D) illustrate how to form such a vertical transistor as shown in FIGS. 7(A) and 7(B) in a bipolar integrated circuit. First, as shown in FIG. 8(A), a buried layer 62 is formed in a P type silicon substrate 61. On the substrate 61 and the buried layer 62 an N type epitaxial layer 63 is formed. The surface of the layer 63 is thermally oxidized to form a $SiO_2$ film 64. To form isolation layers for electrically isolate semiconductor elements in an integrated circuit, a predetermined number of openings are made in the $SiO_2$ film 64 at desired positions. In these openings and on the $SiO_2$ film 64 a BSG (boron silicate glass) film (not shown) is formed by CVD (chemical vapour deposition) method. Then, the semiconductor wafer is heated to 1200° C. in an oxidizing atmosphere, thereby forming an isolation layer 65 as shown in FIG. 8(B). The portion of the epitaxial layer 63 which is surrounded by the isolation layer 65 constitutes an N type collector region. Both the $SiO_2$ film 64 and the BSG film (not shown) are then removed. This done, a new $SiO_2$ film 66 is formed on the epitaxial layer 63, and an opening is made in the $SiO_2$ film 66 to form a base region in the N type collector region 63. In the opening and on the $SiO_2$ film 66 a new BSG film 67 is formed by CVD method.

Figure 8C:
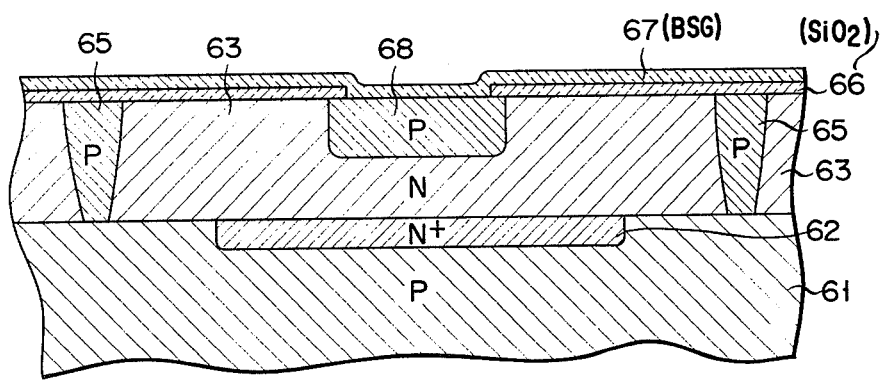
Figure 8D:
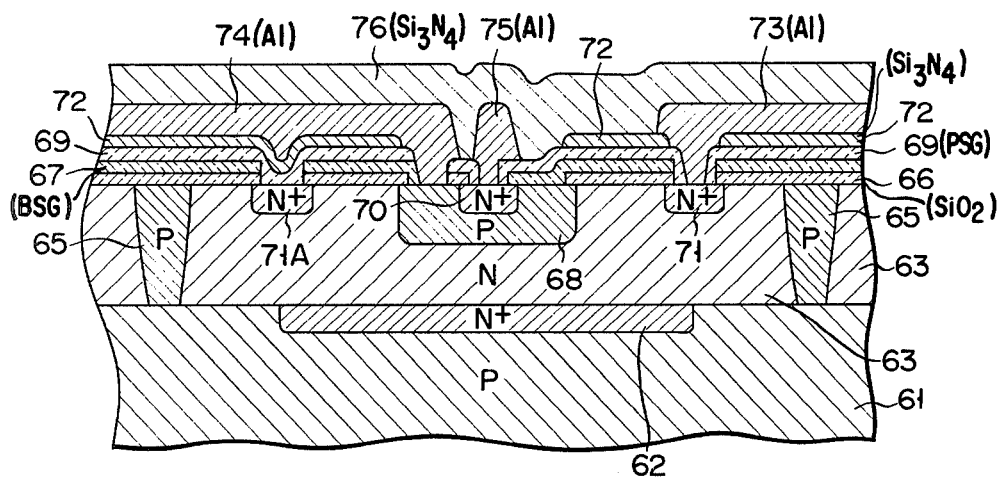

The semiconductor wafer is heated to about 1200° C. in a neutral or reducing atmosphere to form a P type base region 68 as shown in FIG. 8(C). Then, openings are made in the $SiO_2$ film 66 and the BSG film 67 thereby to expose some portions of the epitaxial layer 63 in order to form an emitter region and a collector contact region. On the BSG film 67 and the $SiO_2$ film 66 a PSG (phosphorous silicate glass) film 69 is formed, which is connected to the epitaxial layer 63 through the openings. This done, the semiconductor wafer is heated to 1100° C. in an oxidation atmosphere, thereby forming an emitter region 70 and a collector contact region 71 as illustrated in FIG. 8(D). At the same time, a channel-cut layer 71A is formed, too. A $Si_3N_4$ film 72 about 1000 Å thick is formed on the PSG film 69 by a low-pressure CVD method at 850° C.

Thereafter, those portions of the $Si_3N_4$ film 72 which lie above the base region 68 and the emitter region 70 are removed by the known photoetching method. Further, an opening is made in the $Si_3N_4$ film 72 to expose the collector contact region 71. Thus, the base region 68, emitter region 70 and collector contact region 71 are exposed to the atmosphere. This done, aluminum is vacuum-vaporized to cover the entire surface of the semiconductor wafer, thus providing a electrode film. The electrode film is photoetched in a desired pattern, thereby forming a collector electrode 73, a base electrode 74 and an emitter electrode 75. The semiconductor wafer now provided with the aluminum electrodes 73, 74 and 75 is then subjected to sintering at 500° C. for 10 minutes. After the sintering process, a $Si_3N_4$ film 76 is formed by plasma CVD method or RF-sputtering method to cover the entire surface of the wafer, thus protecting the aluminum electrodes 73, 74 and 75. Thus ends the manufacture of a desired integrated circuit.

As shown in FIG. 8(C), the $Si_3N_4$ film 72 is formed above the N type collector region surrounded by the isolation layer 65, but not above the base region 68 or above the emitter region 70. The $Si_3N_4$ film 72 lies also below the base electrode 74 which extends above the N+ type channel-cut layer 71A, as shown in FIG. 8(D). The $Si_3N_4$ film 72, which lies at such positions, effectively helps enhance the withstand voltage of the integrated circuit.

Figure 9:
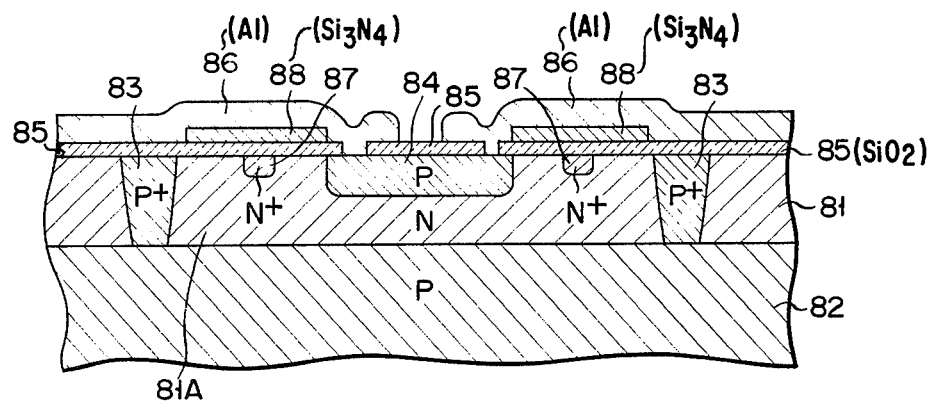
FIG. 9 is a cross sectional view of another semiconductor device according to this invention.

FIG. 9 shows an integrated circuit device according to this invention which is provided with a resistor. The device comprises a P type silicon substrate 82, an N type epitaxial layer 81 formed on the substrate 82, a P+ type isolation layer 83 formed in the epitaxial layer 81, and a P type diffusion layer 84 formed in that portion 81A of the layer 81 which is surround by the isolation layer 83. A $SiO_2$ film 85 having two openings is formed on the epitaxial layer 81. Through these openings the P type diffusion layer 84 is exposed, and a pair of electrode layers 86 are connected to the P type diffusion layer 84, thus providing a resistor. A channel-cut diffusion layer 87 is formed in the portion 81A of the layer 81 so as to surround the P type diffusion layer 84. Above the channel-cut diffusion layer 87, a $Si_3N_4$ film 88 is formed through the $SiO_2$ film 85. The $Si_3N_4$ film 88 serves to elevate the threshold voltage of the integrated circuit device and prevent parasitic PNP elements, whereby the device has a high reliability.

What we claim is:
1. A lateral semiconductor device comprising:
   (a) a semiconductor body of N conductivity type;
   (b) an emitter region of P conductivity type formed in the surface of said semiconductor body;
   (c) a collector region of P conductivity type formed in the surface of said semiconductor body, separated from and surrounding said emitter region;
   (d) a channel-cut region formed in the surface of said semiconductor body, separated from and surrounding said collector region; a portion of said channel-cut region forming a base contact region;
   (e) an insulating layer of silicon dioxide formed on said semiconductor body to cover said channel-cut region, and to cover the area of said semiconductor body which said channel-cut regions surrounds;
   (f) a layer of silicon nitride film formed on said insulating layer over said channel-cut region except for said base contact region, over the area between said channel-cut region and said collector region, and over the area between said collector region and said emitter region, but not over said collector, emitter, or base contact regions; and
   (g) electrode means positioned on said layers and selectively passing through said layers for electrically contacting said base contact, emitter, and collector regions; and said silicon nitride film beneath said electrode means being of sufficient thickness to prevent positive charge build-up in the surface of said semiconductor body.

2. A vertical bipolar semiconductor device comprising:
   (a) a semiconductor body of N conductivity type;

(b) a base region of P conductivity type formed in the surface of said semiconductor body;

(c) an emitter region of N conductivity type formed in the surface of said emitter region;

(d) a channel-cut region formed in the surface of said semiconductor body, separated from and surrounding said base region; a portion of said channel-cut region forming a collector contact region;

(e) an insulating layer of silicon dioxide formed on said semiconductor body to cover said channel-cut region, and to cover the area of said semiconductor body which said channel-cut region surrounds;

(f) a layer of silicon nitride film formed on said insulating layer over said channel-cut region, except for said collector contact region, and over the area between said channel-cut region and said base region, but not over said base and collector contact regions; and (g) electrode means positioned on said layers and selectively passing through said layers for electrically contacting said base, emitter, and collector contact regions; and said silicon nitride film beneath said electrode means being of sufficient thickness to prevent positive charge build-up in the surface of said semiconductor body.

3. A resistor semiconductor device comprising:

(a) a semiconductor body of N conductivity type;

(b) a resistor region of P conductivity type formed in the surface of said semiconductor body;

(c) a channel-cut region formed in the surface of said semiconductor body separated from and surrounding said resistor region;

(d) an isolation region formed in the surface of said semiconductor body separated from and surrounding said channel-cut region;

(e) an insulating layer of silicon dioxide formed on said semiconductor body within said isolation region;

(f) a layer of silicon nitride film formed on said insulating layer between said isolation region and said resistor region, but not over said resistor region; and (g) electrode means positioned on said layers and selectively passing through said layers for electrically contacting said resistor region; and said silicon nitride film beneath said electrode means being of sufficient thickness to prevent positive charge build-up in the surface of said semiconductor body.

4. A device of claims 1, 2, or 3 wherein said silicon nitride film is 0.08 microns thick.

5. A device of claims 1, 2, or 3 wherein said insulating layer of silicon dioxide is 1.5 microns thick.

6. A device of claims 1, 2 or 3 wherein said insulating layer of silicon dioxide is 1.5 microns thick and said silicon nitride film is 0.08 microns thick.

* * * * *